(12) United States Patent
Oya et al.

(10) Patent No.: US 12,308,305 B2
(45) Date of Patent: May 20, 2025

(54) POWER SEMICONDUCTOR DEVICE

(71) Applicant: Mitsubishi Electric Corporation, Tokyo (JP)

(72) Inventors: Daisuke Oya, Tokyo (JP); Yukimasa Hayashida, Fukuoka (JP); Tetsuo Motomiya, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/754,779

(22) PCT Filed: Nov. 28, 2019

(86) PCT No.: PCT/JP2019/046503
§ 371 (c)(1),
(2) Date: Apr. 12, 2022

(87) PCT Pub. No.: WO2021/106131
PCT Pub. Date: Jun. 3, 2021

(65) Prior Publication Data
US 2024/0297104 A1    Sep. 5, 2024

(51) Int. Cl.
*H01L 23/498* (2006.01)
*H01L 23/00* (2006.01)

(52) U.S. Cl.
CPC ........ *H01L 23/49811* (2013.01); *H01L 24/48* (2013.01); *H01L 2224/48091* (2013.01);
(Continued)

(58) Field of Classification Search
CPC ............... H01L 23/49811; H01L 24/48; H01L 2224/48091; H01L 2224/48225;
(Continued)

(56) References Cited

U.S. PATENT DOCUMENTS

2020/0266240 A1    8/2020  Morisaki et al.
2021/0280555 A1*   9/2021  Murata ................... H01L 24/49

FOREIGN PATENT DOCUMENTS

| JP | 2005-12053 A | 1/2005 |
|----|---|---|
| JP | 2010-16925 A | 1/2010 |
| WO | 2018/193929 A1 | 10/2018 |
| WO | WO-2020209166 A1 * | 10/2020 ............. H01L 21/56 |

OTHER PUBLICATIONS

International Search Report issued in PCT/JP2019/046503; mailed Feb. 4, 2020.

(Continued)

*Primary Examiner* — Shahed Ahmed
(74) *Attorney, Agent, or Firm* — Studebaker Brackett PLLC

(57) ABSTRACT

An object of the present invention is to provide a power semiconductor device enabling a downsizing of a module. A power semiconductor device according to the present invention includes: emitter main electrodes each provided in each of a plurality of semiconductor chips; and main electrode emitter sense terminals directly connected to each of the emitter main electrodes and partially exposed outside a module, wherein each of the main electrode emitter sense terminals is located diagonally to each other, and a distance from each of the main electrode emitter sense terminals to each of the emitter main electrodes connected to each of the main electrode emitter sense terminals is smaller than a distance between the main electrode emitter sense terminals in a plan view outside the module.

13 Claims, 4 Drawing Sheets

(52) U.S. Cl.
CPC ............... *H01L 2224/48225* (2013.01); *H01L 2924/10253* (2013.01); *H01L 2924/10272* (2013.01); *H01L 2924/12032* (2013.01); *H01L 2924/13055* (2013.01); *H01L 2924/13091* (2013.01)

(58) Field of Classification Search
CPC . H01L 2924/10253; H01L 2924/10272; H01L 2924/12032; H01L 2224/48227; H01L 2224/73265; H01L 2924/181; H01L 2924/13055; H01L 2924/13091; H01L 25/072; H01L 25/07–074; H01L 25/11–117; H01L 23/28–3192; H01L 23/3142; H05K 1/00–189
See application file for complete search history.

(56) References Cited

OTHER PUBLICATIONS

An Office Action; "Notice of Reasons for Refusal", mailed by the Japanese Patent Office on Jun. 21, 2022, which corresponds to Japanese Patent Application No. 2021-561061 and is related to U.S. Appl. No. 17/754,779; with English language translation.

An Office Action mailed by China National Intellectual Property Administration on Aug. 15, 2024, which corresponds to Chinese Patent Application No. 201980102448.5 and is related to U.S. Appl. No. 17/754,779; with English language translation.

Office Action issued in DE 11 2019 007 924.7; mailed by the German Patent and Trademark Office on Jan. 2, 2025.

* cited by examiner

POWER SEMICONDUCTOR DEVICE

TECHNICAL FIELD

The present invention relates to a power semiconductor device used for controlling a motor of an electrical railroad apparatus or an automobile apparatus, for example.

BACKGROUND ART

There is a method of controlling a short-circuit protection by a difference of inductance between a main electrode emitter electrode and an auxiliary emitter electrode in a power semiconductor device. A conventional power semiconductor device has a configuration of connecting a main electrode emitter sense terminal to a circuit pattern on an insulating substrate provided in a module and leading out a part of the main electrode emitter sense terminal outside the module. However, the configuration has a problem that a wiring is complicated and a space on the insulating substrate is limited.

Proposed is a configuration that the main electrode emitter sense terminal is externally mounted on the module in accordance a downsizing of the module. However, there is concern that in the configuration, the main electrode emitter sense terminal is disposed outside the module, thus insulation properties are reduced. There is also a problem from a viewpoint of operability that an operation of externally mounting the main electrode emitter sense terminal on the module is necessary, for example.

Proposed as measures against the above problems is a configuration that the main electrode emitter sense terminal is directly led outside the module from the main electrode (refer to Patent Documents 1 and 2, for example).

PRIOR ART DOCUMENTS

Patent Documents

Patent Document 1: Japanese Patent Application Laid-Open No. 2005-12053
Patent Document 2: Japanese Patent Application Laid-Open No. 2010-16925

SUMMARY

Problem to be Solved by the Invention

Patent Documents 1 and 2 have a problem that when the main electrode emitter sense terminal is simply led out from the main electrode, an insulation design is necessary by reason that an external output terminal increases, thereby not contributing to the downsizing of the module.

The present invention is therefore has been made to solve problems as described above, and it is an object to provide a power semiconductor device enabling a downsizing of a module.

Means to Solve the Problem

In order to solve the above problems, a power semiconductor device according to the present invention includes: main electrodes each provided in each of a plurality of semiconductor chips; and main electrode emitter sense terminals directly connected to each of the main electrodes and partially exposed outside a module, wherein each of the main electrode emitter sense terminals is located diagonally to each other, and a distance from each of the main electrode emitter sense terminals to each of the main electrodes connected to each of the main electrode emitter sense terminals is smaller than a distance between the main electrode emitter sense terminals in a plan view outside the module.

Effects of the Invention

According to the present invention, a power semiconductor device includes: main electrodes each provided in each of a plurality of semiconductor chips; and main electrode emitter sense terminals directly connected to each of the main electrodes and partially exposed outside a module, wherein each of the main electrode emitter sense terminals is located diagonally to each other, and a distance from each of the main electrode emitter sense terminals to each of the main electrodes connected to each of the main electrode emitter sense terminals is smaller than a distance between the main electrode emitter sense terminals in a plan view outside the module, thus a downsizing of the module can be achieved.

These and other objects, features, aspects and advantages of the present invention will become more apparent from the following detailed description of the present invention when taken in conjunction with the accompanying drawings.

DESCRIPTION OF EMBODIMENT(S)

Embodiments of the present invention are described hereinafter based on the drawings.

Related Technique

A technique relating to an embodiment of the present invention is described.

Figure 7:
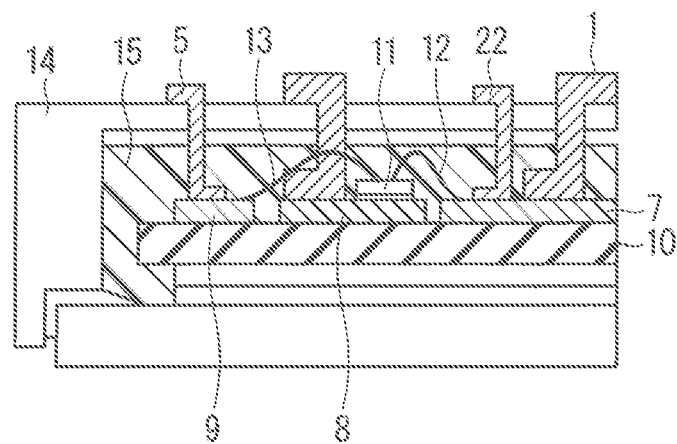
FIG. 7 is a cross-sectional view illustrating an example of a configuration of a power semiconductor device according to a related technique.

FIG. 7 is a cross-sectional view illustrating an example of a configuration of a power semiconductor device according to a related technique.

As illustrated in FIG. 7, metal patterns 7, 8, and 9 are provided on an insulating material 10. The metal patterns 7, 8, and 9 correspond to a circuit pattern described above. An emitter main electrode 1 and a main electrode emitter sense terminal 22 are provided on the metal pattern 7. A semiconductor chip 11 is provided on the metal pattern 8. An auxiliary emitter sense terminal 5 is provided on the metal pattern 9.

The metal pattern 7 is connected to an emitter electrode as a main electrode of the semiconductor chip 11 via a bonding wire 12. The metal pattern 9 is connected to the emitter electrode as the main electrode of the semiconductor chip 11 via a bonding wire 13.

A case 14 is provided so that the emitter main electrode 1, the main electrode emitter sense terminal 22, and the auxiliary emitter sense terminal 5 are partially exposed outside. A sealing agent 15 fills inside the case 14. The case 14 defines an outline of a module including the power semiconductor device.

As described above, a configuration illustrated in FIG. 7 has problems that a wiring for leading the main electrode emitter sense terminal 22 outside the case 14 is complicated and a space on the insulating material 10 is limited, for example.

Figure 8:
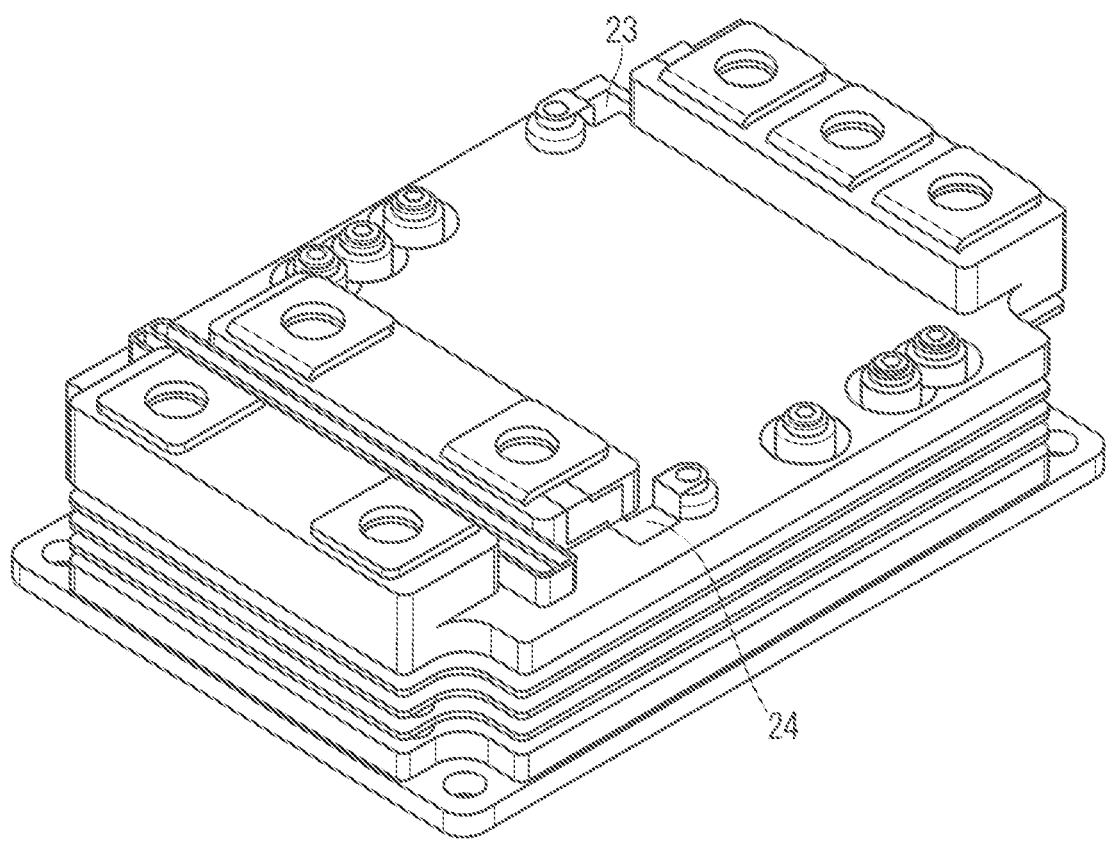
FIG. 8 is a diagram illustrating an outer appearance of a module including a power semiconductor device according to a related technique.

FIG. 8 is a diagram illustrating an outer appearance of a module including a power semiconductor device according to a related technique.

As illustrated in FIG. 8, main electrode emitter sense terminal 23 and 24 are externally mounted on the module. As described above, there is concern that in the configuration illustrated in FIG. 8, the main electrode emitter sense terminals 23 and 24 are disposed outside the module, thus insulation properties are reduced. There is also a problem from a viewpoint of operability that an operation of externally mounting the main electrode emitter sense terminals 23 and 24 on the module is necessary, for example.

The present embodiment is made to solve the above problems, and is described in detail hereinafter.

Embodiment

Figure 1:
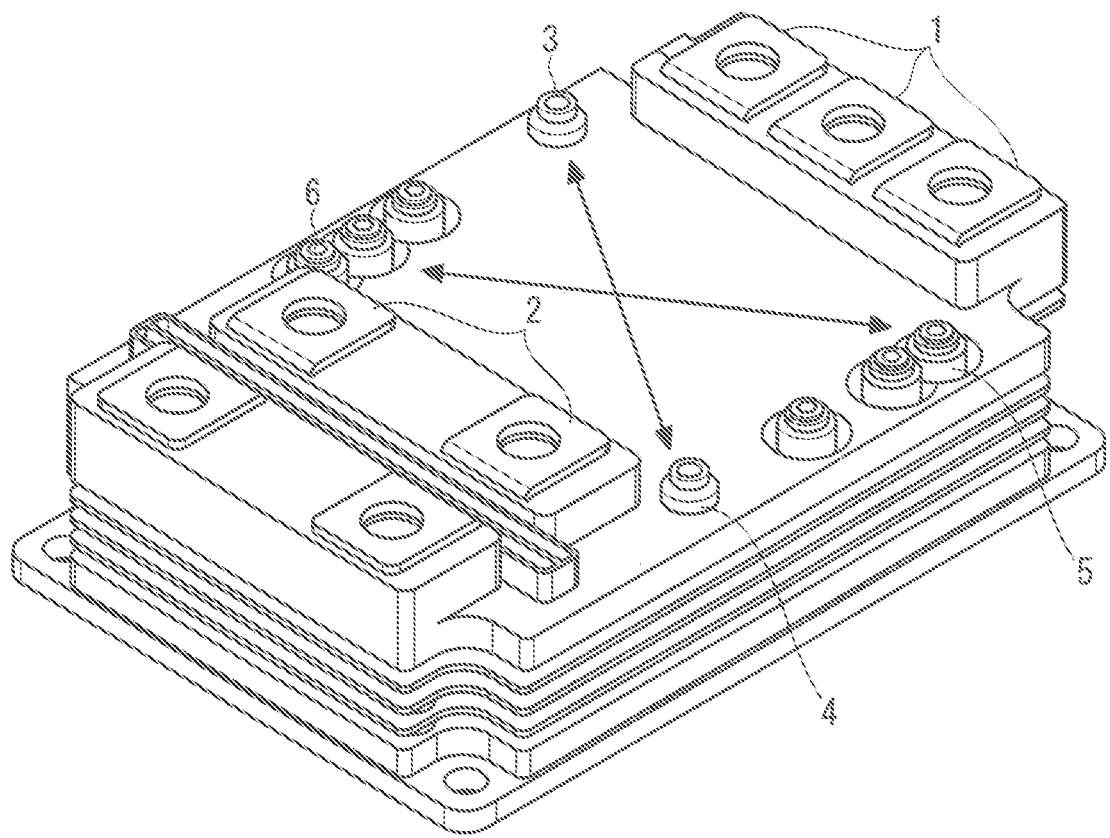
FIG. 1 is a diagram illustrating an outer appearance of a module including a power semiconductor device according to an embodiment of the present invention.

FIG. 1 is a diagram illustrating an outer appearance of a module including a power semiconductor device according to the present embodiment. FIG. 1 illustrates a two-in-one module as an example.

As illustrated in FIG. 1, the module includes the emitter main electrode 1 and an emitter main electrode 2. A main electrode emitter sense terminal 3 and the auxiliary emitter sense terminal 5 having the same potential as the emitter main electrode 1 are provided near the emitter main electrode 1. A main electrode emitter sense terminal 4 and an auxiliary emitter sense terminal 6 having the same potential as the emitter main electrode 2 are provided near the emitter main electrode 2. The main electrode emitter sense terminals 3 and 4 have a function of detecting potential of the emitter electrode as a main electrode of the semiconductor chip. The auxiliary emitter sense terminals 5 and 6 have a function of detecting potential near the semiconductor chip.

The main electrode emitter sense terminals 3 and 4 are led outside the module so as to be located diagonally to each other in a plan view. A distance from the main electrode emitter sense terminals 3 and 4 to the emitter main electrodes 1 and 2 connected to the main electrode emitter sense terminals 3 and 4, respectively, is smaller than a distance between the main electrode emitter sense terminals 3 and 4 in a plan view.

The auxiliary emitter sense terminals 5 and 6 are led outside the module so as to be located diagonally to each other to be opposite to the main electrode emitter sense terminals 3 and 4 in a plan view.

Figure 2:
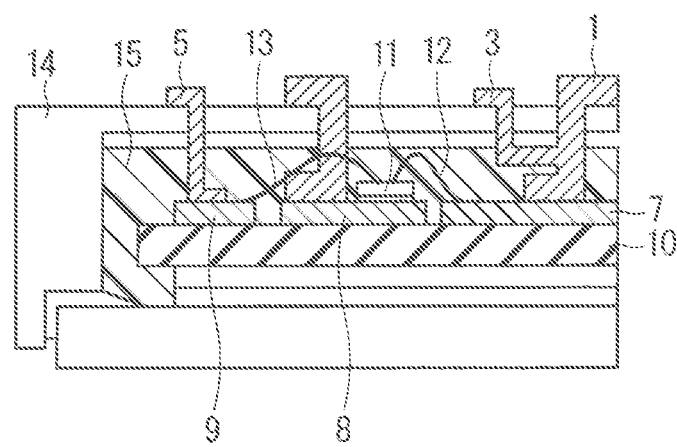
FIG. 2 is a cross-sectional view illustrating an example of a configuration of the power semiconductor device according to the embodiment of the present invention.

FIG. 2 is a cross-sectional view illustrating an example of a configuration of a power semiconductor device according to the present embodiment.

The power semiconductor device according to the present embodiment has a feature that the main electrode emitter sense terminal 3 is directly connected to the emitter main electrode 1. In the example in FIG. 2, the main electrode emitter sense terminal 3 is branched from the emitter main electrode 1 and led outside the module. FIG. 2 illustrates the main electrode emitter sense terminal 3, and the same applies to the main electrode emitter sense terminal 4.

The main electrode emitter sense terminal 3 is led outside the module. As with the example in FIG. 2, when the main electrode emitter sense terminal 3 is led outside the module, a process of bending the main electrode emitter sense terminal 3 is necessary. At this time, a crush process is preferably performed on the main electrode emitter sense terminal 3 to easily perform a bending operation.

The metal patterns 7, 8, and 9 are provided on the insulating material 10. The emitter main electrode 1 is provided on the metal pattern 7 by ultrasonic (US) joint or solder joint. The emitter main electrode 1 is made up of metal such as copper (Cu) or aluminum (Al), for example. The insulating material 10 is made up of ceramic such as aluminum nitride (AlN), silicon nitride (SiN), or alumina ($Al_2O_3$) or polymer resin, for example.

The semiconductor chip 11 is provided on the metal pattern 8. The semiconductor chip 11 may be an insulated gate bipolar transistor (IGBT) or a diode made of silicon (Si). The semiconductor chip 11 may be preferably an SiC-MOSFET or an SiC-SBD (Schottky barrier diode) using a wide bandgap semiconductor material such as silicon carbide (SIC).

The auxiliary emitter sense terminal 5 is provided on the metal pattern 9. The metal pattern 7 is connected to the emitter electrode as the main electrode of the semiconductor chip 11 via the bonding wire 12. The metal pattern 9 is connected to the emitter electrode as the main electrode of the semiconductor chip 11 via the bonding wire 13.

The case 14 is provided so that the emitter main electrode 1, the main electrode emitter sense terminal 3, and the auxiliary emitter sense terminal 5 are partially exposed outside. The sealing agent 15 fills inside the case 14. The case 14 is formed of resin such as polyphenylene sulfide (PPS), polyethylene terephthalate (PET)+polybutylene terephthalate (PBT), PBT, or nylon.

Modification Example 1

Figure 3:
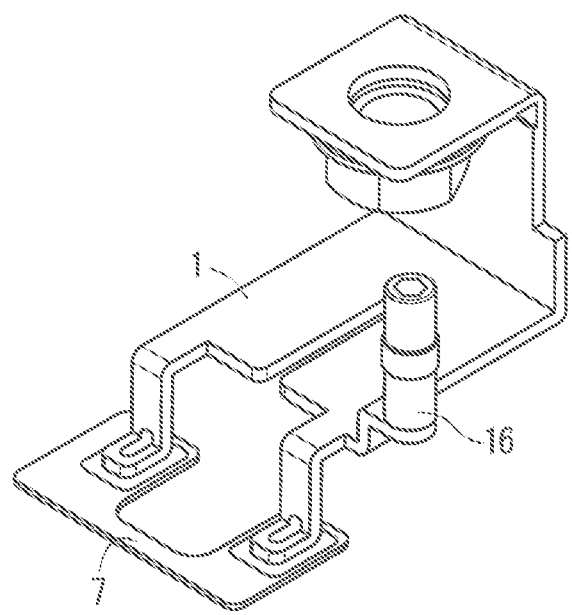
FIG. 3 is a diagram illustrating an example of a main electrode emitter sense terminal according to the embodiment of the present invention.

FIG. 3 is a diagram illustrating an example of the main electrode emitter sense terminal 3 according to the present embodiment. FIG. 3 illustrates an example of the main electrode emitter sense terminal 3, and the same applies to the main electrode emitter sense terminal 4.

FIG. 3 illustrates a case where the main electrode emitter sense terminal 3 is a cylindrical nut 16. The cylindrical not 16 is made up of metal such as steel use stainless (SUS), Cu, or Al, for example.

A structure illustrated in FIG. 3 can be formed by insert molding or outsert molding. In the insert molding, the emitter main electrode 1 is set after setting the cylindrical nut 16 in a molding. Subsequently, the cylindrical nut 16 and the emitter main electrode 1 are swaged at a time of mold close of a resin molding die. It is also applicable to set the cylindrical nut 16 and the emitter main electrode 1 which have been swaged in advance.

In the outsert molding, the cylindrical nut 16 and the emitter main electrode 1 which have been swaged in advance are inserted into a case which has been molded in advance. There is a possibility that a load is applied on the case in the outsert molding, thus the cylindrical nut 16 and the emitter main electrode 1 are preferably swaged before being inserted into the case.

As an alternative to the above configurations, it is also applicable that burring processing or tapping processing is performed on the emitter main electrode 1, and the cylindrical nut 16 is connected to the processed portion. The emitter main electrode 1 and the cylindrical nut 16 may be connected with a screw.

Modification Example 2

Figure 4:
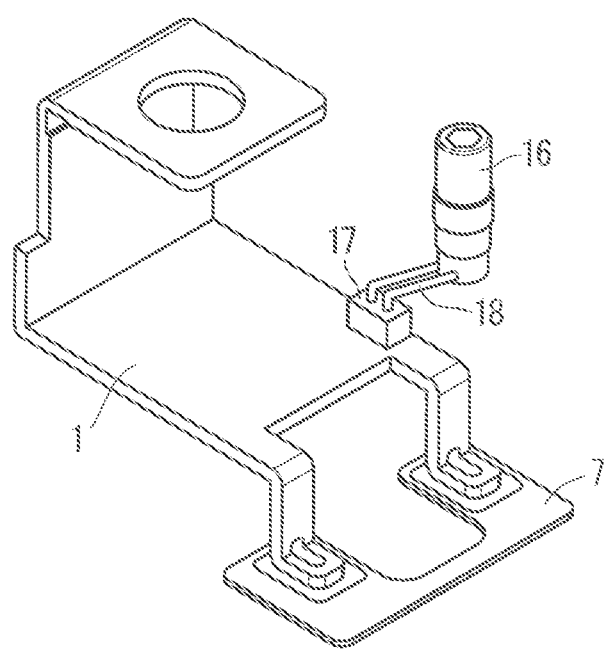
FIG. 4 is a diagram illustrating an example of the main electrode emitter sense terminal according to the embodiment of the present invention.

FIG. 4 is a diagram illustrating an example of the main electrode emitter sense terminal 3 according to the present embodiment. FIG. 4 illustrates an example of the main electrode emitter sense terminal 3, and the same applies to the main electrode emitter sense terminal 4.

In the example in FIG. 4, the main electrode emitter sense terminal 3 includes the cylindrical nut 16, a lead wiring 18 connected to the cylindrical nut 16, and a connector 17 connected to the lead wiring 18. The connector 17 is connected to the emitter main electrode 1.

Modification Example 3

Figure 5:
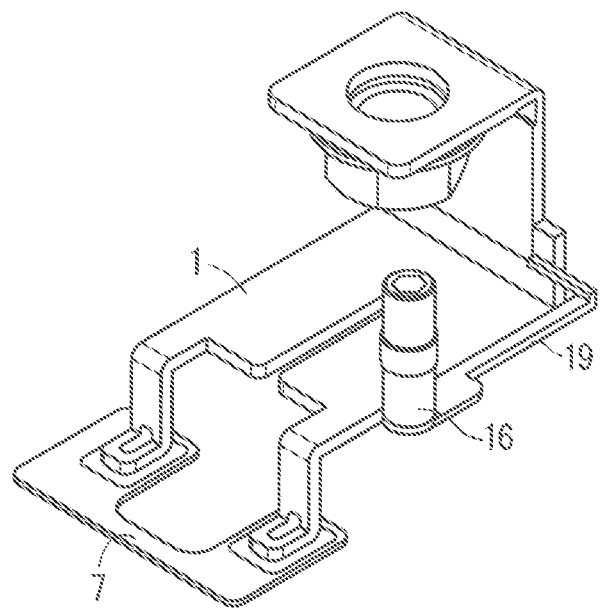
FIG. 5 is a diagram illustrating an example of the main electrode emitter sense terminal according to the embodiment of the present invention.

FIG. 5 is a diagram illustrating an example of the main electrode emitter sense terminal 3 according to the present embodiment. FIG. 5 illustrates an example of the main electrode emitter sense terminal 3, and the same applies to the main electrode emitter sense terminal 4.

In the example in FIG. 5, the main electrode emitter sense terminal 3 includes the cylindrical nut 16 and an insert wiring 19 connected to the cylindrical nut 16. The insert wiring 19 is connected to the emitter main electrode 1. The cylindrical nut 16 and the insert wiring 19 are preferably connected by swaging, burring processing, or tapping processing.

The main electrode emitter sense terminal 3 needs not have the cylindrical nut 16. In this case, one end of the insert wiring 19 is connected to the emitter main electrode 1, and the other end thereof is led outside the module.

Modification Example 4

Figure 6:
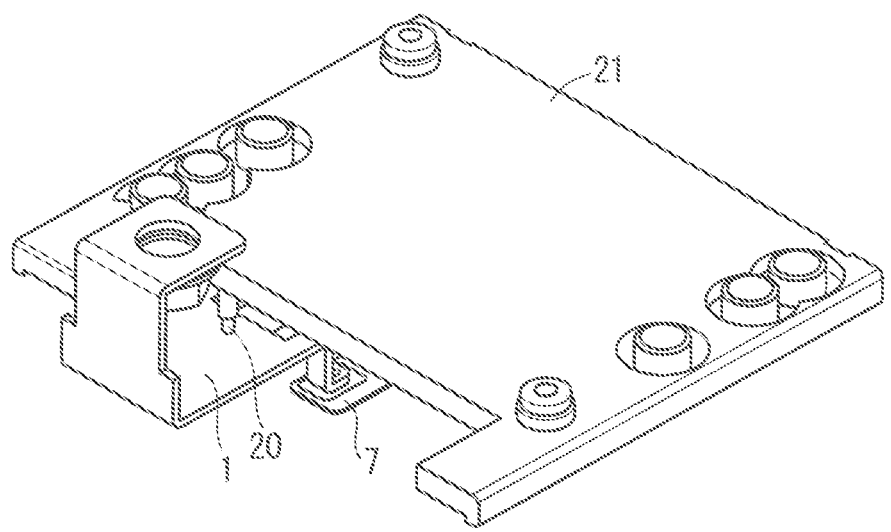
FIG. 6 is a diagram illustrating an example of the main electrode emitter sense terminal according to the embodiment of the present invention.

FIG. 6 is a diagram illustrating an example of the main electrode emitter sense terminal 3 according to the present embodiment. FIG. 6 illustrates an example of the main electrode emitter sense terminal 3, and the same applies to the main electrode emitter sense terminal 4.

In the example in FIG. 6, the main electrode emitter sense terminal 3 is a spring contact pin 20 provided inside a cover 21 of the module. When the cover 21 is attached to the case 14, the spring contact pin 20 has contact with the emitter main electrode 1. In this case, it is sufficient that a contact area between the spring contact pin 20 and the emitter main electrode 1 is covered with the sealing agent 15 made up of silicon series gel or epoxy series resin.

Effect

In the power semiconductor device according to the present embodiment, the main electrode emitter sense terminals 3 and 4 are directly connected to the emitter main electrodes 1 and 2. Accordingly, the external main electrode emitter sense terminals 23 and 24 illustrated in FIG. 8 is unnecessary, thus operability is improved, and reduction in insulation properties can be suppressed.

The main electrode emitter sense terminals 3 and 4 are disposed near the emitter main electrodes 1 and 2 having the same potential, thus an insulation design is easily performed, and a downsizing of the module can be achieved.

Furthermore, the main electrode emitter sense terminals 3 and 4 are disposed diagonally to each other, and the auxiliary emitter sense terminals 5 and 6 are disposed diagonally to each other to be opposite to the main electrode emitter sense terminals 3 and 4, thus a gate driver controlling the module can be firmly attached to the module.

It is conventionally difficult to downsize the module to match performance of the wide bandgap semiconductor material due to a limitation of a package such as an insulation distance or an inner wiring. However, according to the power semiconductor device of the present embodiment, the downsizing of the package can also be achieved, and the performance of the wide bandgap semiconductor material can be utilized. The wide bandgap semiconductor material is used, thus a high temperature operation and a high speed operation of the module can be achieved, and a cooler and a control circuit (any of them is not shown) around the module can be downsized.

According to the present invention, the above embodiments can be appropriately varied or omitted within the scope of the invention.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1, 2 emitter main electrode, 3, 4 main electrode emitter sense terminal, 5, 6 auxiliary emitter sense terminal, 7, 8, 9 metal pattern. 10 insulating material, 11 semiconductor chip, 12, 13 bonding wire, 14 case, 15 sealing agent, 16 cylindrical out, 17 connector, 18 lead wiring, 19 insert wiring, 20 spring contact pin, 21 cover, 22, 23, 24 main electrode emitter sense terminal.

The invention claimed is:
1. A power semiconductor device, comprising:
main electrodes each connected to corresponding ones of a plurality of semiconductor chips;
main electrode emitter sense terminals each directly connected to a corresponding one of the main electrodes and partially exposed outside a module; and
auxiliary emitter sense terminals indirectly connected to each of the main electrodes and partially exposed outside the module, wherein
each of the main electrode emitter sense terminals is located diagonally to each other, and a distance from each of the main electrode emitter sense terminals to each of the main electrodes connected to each of the main electrode emitter sense terminals is smaller than a distance between the main electrode emitter sense terminals in a plan view outside the module, and
each of the auxiliary emitter sense terminals is located diagonally to each other.

2. The power semiconductor device according to claim 1, wherein
each of the auxiliary emitter sense terminals is located opposite to the main electrode emitter sense terminals in a plan view outside the module.

3. The power semiconductor device according to claim 1, wherein
each of the main electrode emitter sense terminals is a cylindrical nut, and is connected to each of the main electrodes by swaging.

4. The power semiconductor device according to claim 1, wherein
each of the main electrode emitter sense terminals is a cylindrical nut, and is connected to each of the main electrodes with a screw.

5. The power semiconductor device according to claim 1, wherein
each of the main electrode emitter sense terminals includes a cylindrical nut, a lead wiring connected to the cylindrical nut, and a connector connected to the lead wiring, and
the connector is connected to each of the main electrodes.

6. The power semiconductor device according to claim 1, wherein
each of the main electrode emitter sense terminals includes a cylindrical nut and an insert wiring connected to the cylindrical nut, and
the insert wiring is connected to each of the main electrodes.

7. The power semiconductor device according to claim 1, wherein
each of the main electrode emitter sense terminals is an insert wiring connected to each of the main electrodes.

8. The power semiconductor device according to claim 1, wherein
each of the main electrode emitter sense terminals is a spring contact pin provided inside a cover of the module.

9. The power semiconductor device according to claim 8, wherein
the main electrodes and the spring contact pin are covered with a sealing agent.

10. The power semiconductor device according to claim 1, wherein
each of the semiconductor chips is made up of a wide bandgap semiconductor material.

11. The power semiconductor device according to claim 1, wherein each of the main electrode emitter sense terminals is bent inside the module.

12. A power semiconductor device, comprising:
main electrodes each connected to a corresponding one of a plurality of semiconductor chips; and
main electrode emitter sense terminals each directly connected to a corresponding one of the main electrodes and partially exposed outside a module, wherein
each of the main electrode emitter sense terminals is located diagonally to each other, and a distance from each of the main electrode emitter sense terminals to each of the main electrodes connected to each of the main electrode emitter sense terminals is smaller than a distance between the main electrode emitter sense terminals in a plan view outside the module, and
each of the main electrode emitter sense terminals is a cylindrical nut, and is connected to each of the main electrodes by swaging.

13. A power semiconductor device, comprising:
main electrodes each connected to a corresponding one of a plurality of semiconductor chips; and
main electrode emitter sense terminals each directly connected to a corresponding one of the main electrodes and partially exposed outside a module, wherein
each of the main electrode emitter sense terminals is located diagonally to each other, and a distance from each of the main electrode emitter sense terminals to each of the main electrodes connected to each of the main electrode emitter sense terminals is smaller than a distance between the main electrode emitter sense terminals in a plan view outside the module, and
each of the main electrode emitter sense terminals is an insert wiring connected to each of the main electrodes.

* * * * *